United States Patent
Xie

(10) Patent No.: US 8,101,984 B2
(45) Date of Patent: Jan. 24, 2012

(54) SPIN INJECTOR

(75) Inventor: Ya-Hong Xie, Beverly Hills, CA (US)

(73) Assignee: The Regents of the University of California, Oakland, CA (US)

( * ) Notice: Subject to any disclaimer, the term of this patent is extended or adjusted under 35 U.S.C. 154(b) by 175 days.

(21) Appl. No.: 12/307,739

(22) PCT Filed: Jun. 22, 2007

(86) PCT No.: PCT/US2007/071940
§ 371 (c)(1),
(2), (4) Date: Jan. 6, 2009

(87) PCT Pub. No.: WO2008/005719
PCT Pub. Date: Jan. 10, 2008

(65) Prior Publication Data
US 2009/0278182 A1    Nov. 12, 2009

Related U.S. Application Data

(60) Provisional application No. 60/819,026, filed on Jul. 7, 2006.

(51) Int. Cl.
*H01L 29/72* (2006.01)
(52) U.S. Cl. .................. 257/295; 257/24; 257/421
(58) Field of Classification Search .......... 257/295, 257/24, 421
See application file for complete search history.

(56) References Cited

U.S. PATENT DOCUMENTS

| | | | |
|---|---|---|---|
| 6,297,987 B1 | 10/2001 | Johnson et al. | |
| 6,713,195 B2 | 3/2004 | Wang et al. | |
| 6,833,567 B2 * | 12/2004 | Choi et al. | 257/135 |
| 7,345,296 B2 * | 3/2008 | Tombler et al. | 257/9 |
| 7,365,395 B2 * | 4/2008 | Stumbo et al. | 257/347 |
| 7,786,086 B2 * | 8/2010 | Reches et al. | 530/300 |
| 2004/0178460 A1 | 9/2004 | Lee et al. | |
| 2009/0278556 A1 * | 11/2009 | Man et al. | 324/693 |
| 2010/0155696 A1 * | 6/2010 | Duan et al. | 257/14 |

OTHER PUBLICATIONS

PCT International Search Report for PCT/US2007/071940 dated Feb. 14, 2008, Applicant: The Regents of the University of California, Form PCT/ISA/210 and 220 (4 pages).
PCT Written Opinion for PCT/US2007/071940 dated Feb. 14, 2008, Applicant: The Regents of the University of California, Form PCT/ISA/237 (6 pages).
PCT International Preliminary Report on Patentability (Chapter I of the Patent Cooperation Treaty) for PCT/US2007/071940, Applicant: The Regents of the University of California, Form PCT/IB/326 and 373, dated Jan. 22, 2009 (7 pages).

* cited by examiner

*Primary Examiner* — Eugene Lee
(74) *Attorney, Agent, or Firm* — Vista IP Law Group LLP

(57) ABSTRACT

A spin injector for use in a microelectronic device such as a field effect transistor (FET) is disclosed. The spin injector includes an array of ferromagnetic elements disposed within a semiconductor. The ferromagnetic elements within the array are arranged and spaced with respect to one another in a close arrangement such that electrons or holes are spin-polarized when passing through. The spin injector may be located above or at least partially within a source region of the FET. A spin injector structure may also be located above or at least partially within the drain region of the FET. The spin injector includes a semiconductor material containing an array of ferromagnetic elements disposed in the semiconductor material, wherein adjacent ferromagnetic elements within the array are separated by a distance within the range between about 1 nm and 100 nm.

20 Claims, 6 Drawing Sheets

SPIN INJECTOR

REFERENCE TO RELATED APPLICATIONS

This Application is a U.S. National Stage filing under 35 U.S.C. §371 of International Application No. PCT/US2007/071940, filed Jun. 22, 2007, which claims priority of U.S. Provisional Patent Application No. 60/819,026 filed on Jul. 7, 2006. The contents of the aforementioned applications are incorporated by reference as if set forth fully herein. Priority to the aforementioned application is hereby expressly claimed in accordance with 35 U.S.C. §§119, 120, 365 and 371 and any other applicable statutes.

FIELD OF THE INVENTION

The field of the invention generally relates to spin injection devices. More particularly, the field of the invention relates to devices and methods for initializing electrons or other charged carriers with a common spin state.

BACKGROUND OF THE INVENTION

The semiconductor industry is increasingly being driven to decrease the size of semiconductor devices located on integrated circuits. For example, miniaturization is needed to accommodate the increasing density of circuits necessary for today's semiconductor products. Increased packing density and device size reduction has forced semiconductor device structures such as transistors to be located ever closer to one another.

As semiconductor device components become located closer together, the problem of so-called Joule heating becomes more pressing. In general, the bulk flow of electrons within conventional semiconductor devices results in heat that must be dissipated. The problem of Joule heating is limiting the ability of semiconductor manufacturers to produce even smaller, more compact devices. One potential option that reduces the problem of Joule heating is to utilize the spin states of electrons. Electrons have discernable spin states (e.g., up or down) that can be flipped or toggled from one state to another. The amount of energy required to flip electrons from one state to another is much smaller than the amount of energy needed for the bulk movement of charges (e.g., electrons or holes) as in current semiconductor devices. For this reason, spin-based devices offer a promising modality for very small semiconductor-based devices.

The amount of energy required to alter the electron spin may be less than the amount of energy needed for bulk charge movement (as is done in traditional semiconductor devices). For this reason, spin-based devices may offer a promising modality for very small semiconductor-based devices and provide the potential for faster logic devices, such as field-effect transistors (FETs), and may consume less power and generate less heat.

The paramount challenge to the realization of spin-based FETs is how to electronically inject spin-polarized electrons or holes into a semiconductor channel at room temperature. Spin-polarized refers to the state in which all or substantially all of the electrons are initialized to one state (e.g., all or substantially all electrons are in the spin "up" state).

One potential way to initialize electrons has to do with the electrical conductivity mismatch between ferromagnetic materials, which are metals, and semiconductor materials. In this method, electrons pass from a ferromagnetic material into a semiconductor-based material. Unfortunately, efficient spin injection based on this method cannot be achieved because of the mismatch in the density of electrons between the ferromagnetic material and the semiconductor-based material which cause electrons to randomize into different spin states when entering the semiconductor from the ferromagnetic material. Another approach that has been tried relies on quantum mechanical tunneling using an intermediate layer of silicon dioxide. Tunneling injection is, however, associated with high contact resistance. High contact resistance is, unfortunately, detrimental to FET operations. Another alternative polarization method relies on optical polarization of electrons. Optical-based polarization has proved difficult and it is generally believed to be incompatible with most microelectronic applications.

There thus is a need for a device and method that can efficiently inject spin-polarized electrons into semiconductors. The device and method should advantageously produce spin-polarized electrons of one particular state without the randomization problems associated with prior art devices and methods. In addition, such a device and method should be amendable to incorporation into current and contemplated microelectronic devices.

SUMMARY

In one aspect of the invention, a spin injector for use in a microelectronic device such as a field effect transistor (FET) is disclosed. The spin injector includes an array of ferromagnetic elements disposed within a semiconductor. The ferromagnetic elements within the array are arranged and spaced with respect to one another in a close arrangement such that electrons or holes are spin-polarized when passing through. The spin injector may be located above or at least partially within a source region of the FET. A spin injector structure may also be located above or at least partially within the drain region of the FET for use as a spin state analyzer (of electrons or holes). The spin injector includes a semiconductor material containing an array of ferromagnetic elements disposed in the semiconductor material, wherein adjacent ferromagnetic elements within the array are separated by a distance within the range between about 1 nm and 100 nm.

In another aspect of the invention, a spin injector device includes a semiconductor material including first and second electrical contacts and an array of posts disposed in the semiconductor material, the array of posts comprising a ferromagnetic material, wherein adjacent posts within the array are separated by a distance within the range between about 1 nm and 100 nm.

In another aspect of the invention, a spin injector device includes a semiconductor material including first and second electrical contacts and an array of plates disposed in the semiconductor material, the array of plates comprising a ferromagnetic material, wherein adjacent plates within the array are separated by a distance within the range between about 1 nm and 100 nm.

In still another aspect of the invention, a field effect transistor (FET) includes a semiconductor substrate having a source region, a drain region, and a channel region between the source region and the drain region. The FET includes a gate disposed on the semiconductor substrate above the channel region, the gate being operatively coupled to an electrical contact. A spin injector is disposed on the source region, the spin injector comprising a portion of semiconductor material containing any array of ferromagnetic elements disposed in the semiconductor material, wherein adjacent ferromagnetic elements located within the array are separated by a distance within the range between about 1 nm and 100 nm, the spin injector further including an electrical contact.

In another embodiment of the invention, a FET includes a semiconductor substrate having a source region, a drain region, and a channel region between the source region and the drain region. The FET further includes a gate disposed on the semiconductor substrate above the channel region, the gate being operatively coupled to an electrical contact. A spin injector is disposed at least partially within the source region, the spin injector comprising a portion of semiconductor material containing an array of ferromagnetic elements disposed in the semiconductor material, wherein adjacent ferromagnetic elements within the array are separated by a distance within the range between about 1 nm and 100 nm, the spin injector further including an electrical contact.

Further features and advantages will become apparent upon review of the following drawings and description of the preferred embodiments.

DETAILED DESCRIPTION OF THE ILLUSTRATED EMBODIMENTS

Figure 1:
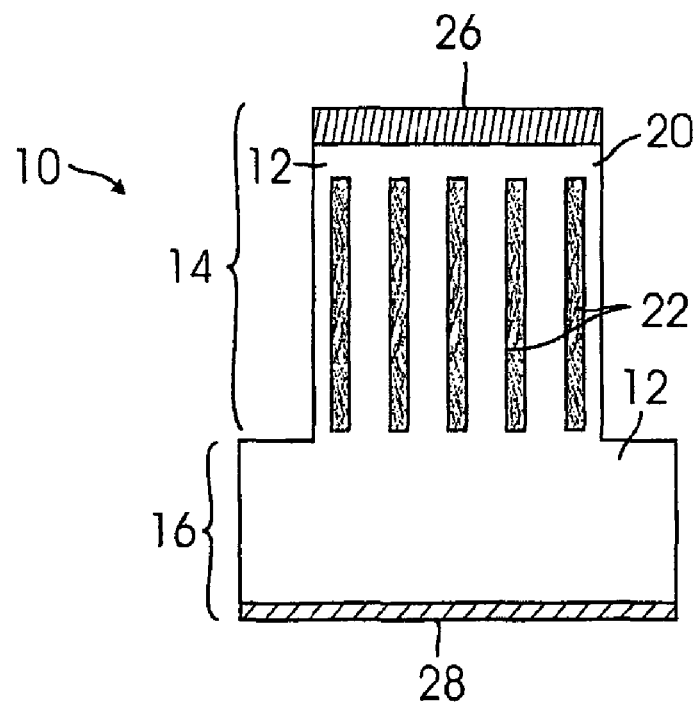
FIG. 1 schematically illustrates a side cross-sectional view of a spin injector structure according to one embodiment. The spin injector includes an array of ferromagnetic posts or pillars located within a semiconductor material.

FIG. 1 schematically illustrates a cross-sectional view of a spin injector 10 according to one aspect of the invention. The spin injector 10 is used to spin-polarize electrons (or holes) into one state by passing through the same. The spin injector 10 includes an elemental or compound semiconductor material 12 known to those skilled in the art. Illustrative semiconductor materials include silicon (Si), gallium arsenide (GaAs), indium arsenide (InAs), gallium nitride (GaN), and other III-V and II-VI compound semiconductor materials.

Figure 2:
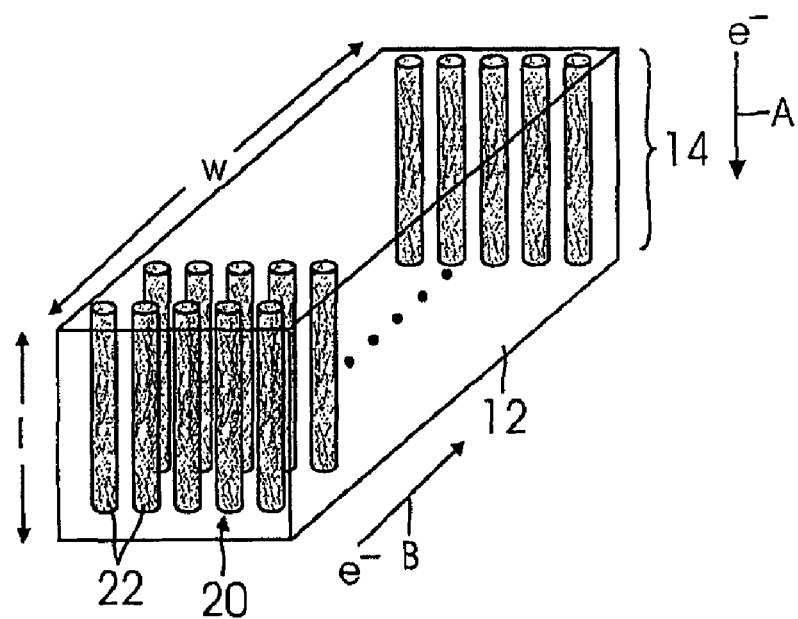
FIG. 2 schematically illustrates a perspective view of a portion of the spin injector structure illustrated in FIG. 1.

As illustrated in FIG. 1, a portion 14 of the semiconductor material 12 includes an array of ferromagnetic elements 20 embedded within the semiconductor material 12. The array of ferromagnetic elements 20 preferably form a three-dimensional array of elements 20 as illustrated, for example, in FIG. 1. The ferromagnetic elements 20 may be regularly arrayed within the semiconductor material 12 such as illustrated in FIG. 2 or, alternatively, the ferromagnetic elements 20 may be randomly or irregularly located within the semiconductor material 12. In the embodiment illustrated in FIGS. 1 and 2, the ferromagnetic elements 20 are formed as posts or pillars 22 within the semiconductor material 12. The ferromagnetic posts 22 may have any number of geometrical shapes. For example, the ferromagnetic posts 22 may have a cylindrical or polygonal shape.

The ferromagnetic elements 20 are formed from a ferromagnetic material. The ferromagnetic material may include, for example, iron (e.g., $\alpha$-Fe or other forms of ferrite), nickel, (Ni), or cobalt (Co). The ferromagnetic material may also include an alloy of one or more metals such as, for instance, a nickel-iron magnetic alloy such as Permalloy (~80% Ni and ~20% Fe).

Still referring to FIGS. 1 and 2, adjacent ferromagnetic elements 20 are separated by a relatively small distance to enable meaningful exposure of the evanescent or non-propagating electron or hole wave function into the ferromagnetic material. The exposure of the wave function to the ferromagnetic material of the ferromagnetic elements 20 is what creates the spin-polarized electrons (or holes). Adjacent ferromagnetic elements 20 should be separated by a distance that permits sufficient interaction with the wave function to substantially spin-polarize the electrons or holes. If the separation distance is too large, then spin-polarization will not be effectuated by the spin injector 10. Conversely, if the separation distance is too short, this will increase the overall resistance of the spin injector 10. It is contemplated that the separation distance between adjacent ferromagnetic elements 20 may be around 1 or a few nanometers. It is believed that the separation distance between adjacent ferromagnetic elements 20 should fall within the range of about 1 nm to 100 nm.

As seen in FIG. 1, the spin injector 10 may include a second portion 16 that is formed from the same semiconductor material 12. The second portion 16 may includes a thickness of semiconducting material that extends beyond one end of the array of ferromagnetic elements 20. The thickness of the second portion 16 illustrated in FIG. 1 is not drawn to scale but generally should not be too long (e.g., more than a few or several microns). Still referring to FIG. 1, the spin injector 10 includes a first electrical contact 26 and a second electrical contact 28. The ferromagnetic posts 20 may be oriented either substantially parallel to or even substantially perpendicular relative to the first and second contacts 26, 28.

For example, FIG. 1 illustrates the ferromagnetic elements 20 being oriented substantially perpendicular to the first and second contacts 26, 28. In this orientation, electron flow may occur in the direction of arrow A in FIG. 2 (e.g., top to bottom). In this regard, electron flow occurs along the length (l) of the ferromagnetic elements 20. Of course, electron (or holes) may also occur in the direction of arrow B in FIG. 2 (e.g., perpendicular to arrow A) in which electron flow occurs along the width (w) of the ferromagnetic elements 20. Depending on the direction of electron flow, the length (l) or width (w) is sufficiently long so that substantially all to the electrons (or holes) are spin-polarized. In yet another embodiment, such as that illustrated in FIGS. 8A and 8B, the ferromagnetic elements 20 are oriented substantially parallel to respective electrical contacts (or parallel to the channel).

Figure 3:
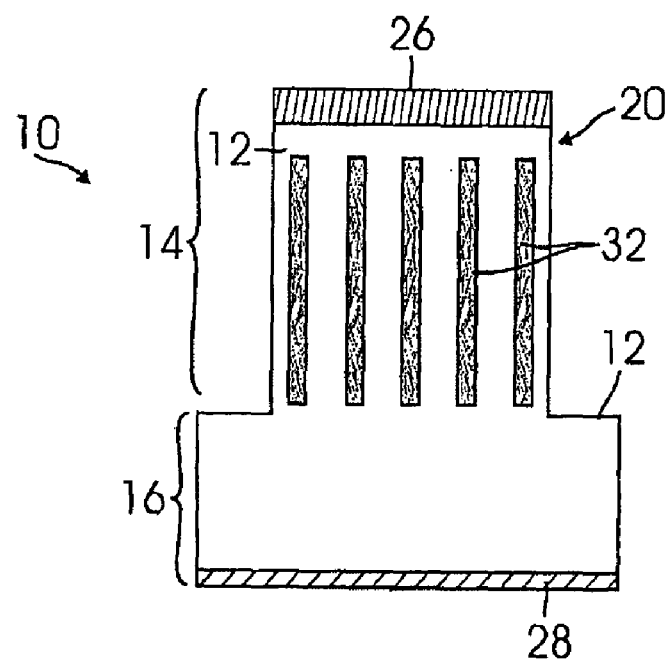
FIG. 3 schematically illustrates a side cross-sectional view of a spin injector structure according to another embodiment. The spin injector includes an array of plates located within a semiconductor material.
Figure 4:
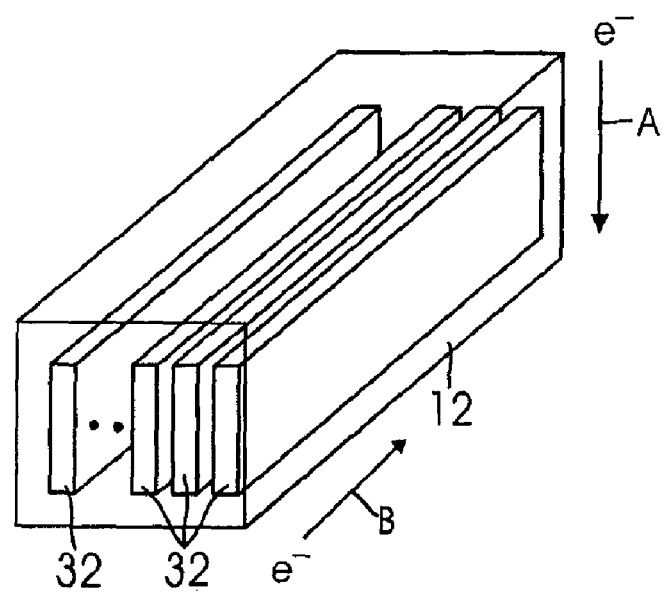
FIG. 4 schematically illustrates a perspective view of a portion of the spin injector structure illustrated in FIG. 3.

FIGS. 3 and 4 illustrate an alternative embodiment of a spin injector 10. The difference between this embodiment and the embodiment illustrated in FIGS. 1 and 2 is that the array of ferromagnetic elements 20 is formed from an array of plates or fins 32. The plates 32 are formed from a ferromagnetic material as described above. In addition, the plates 32 are separated from one another by a distance that may be around 1 or a few nanometers. It is believed that the separation distance between adjacent ferromagnetic plates 32 should fall within the range of about 1 nm to 100 nm. The ferromagnetic plates 32 have a length (l) and a width (w). As in the prior embodiment, the length (l) and width (w) are dimensioned such that substantially all the electrons (or holes) are spin-polarized after having passed between the adjacent ferromagnetic plates 32.

Also, similar to the embodiment of FIGS. 1 and 2, ferromagnetic plates 32 may be oriented generally perpendicular to first and second electrical contacts 26, 28. the electrons or holes may travel in the direction of arrow A in FIG. 4 (e.g., top to bottom or vice versa). Alternatively, electrons (or holes) may travel in the direction of arrow B.

Figure 5:
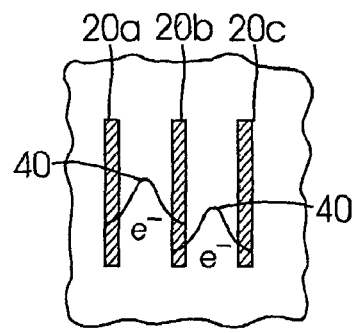
FIG. 5 schematically illustrates the wave function of electrons passing through a spin injector.

FIG. 5 schematically illustrates the wave function 40 of an electron (or hole) as it passes between adjacent ferromagnetic elements 20a, 20b, and 20c. As seen in FIG. 5, because of the quantum mechanical nature of the wave function 40, there is overlap or exposure between the ferromagnetic elements 20a, 20b, and 20c and the electron wave function 40. This interaction causes spin-polarization of the passing electrons (or holes). The dimensions (e.g., length and width) as well as the periodicity of the ferromagnetic elements 20 may be optimize for both (1) high spin efficiency, and (2) low resistance. Both spin efficiency and resistance can compete with one another depending on the dimensions of the spin injector 10. For instance, as the distance between adjacent ferromagnetic elements 20 decreases, the degree of electron (or hole) wave function overlap with the ferromagnetic material increases, and hence, the degree of polarization which is, in turn, associated with increased series resistance. These two offsetting concerns may be optimized to provide for efficient spin polarization without high resistance. It should be noted that there is no electric current flowing through the ferromagnetic elements 20 because there is always a Schottky junction (i.e., the junction between the metal and the semiconductor) that is reversed biased. This feature advantageously avoids the problems associated with diffusive conduction across the interface between ferromagnetic materials and the semiconductor material.

Figure 6A:
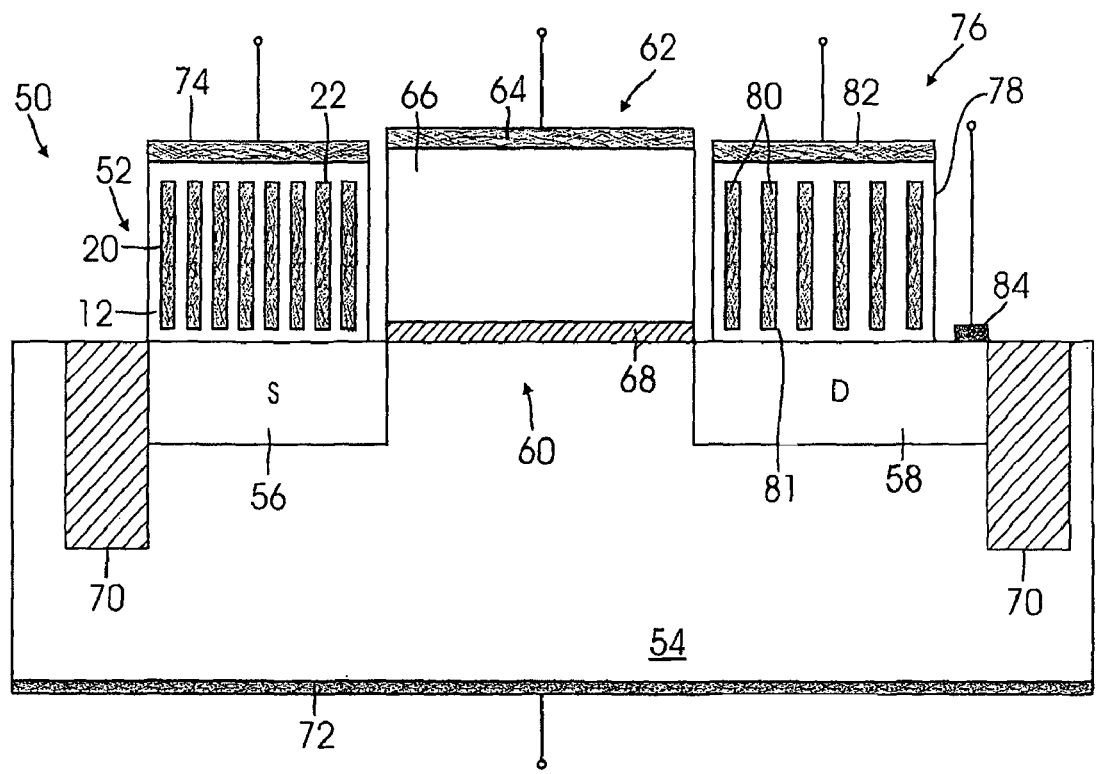
FIG. 6A is a cross-sectional view of a field effect transistor (FET) device that incorporates a spin injector according to one embodiment.

FIG. 6A illustrates one embodiment of a field effect transistor 50 incorporating a spin injector 52. As seen in FIG. 6A, the field effect transistor 50 includes a semiconductor substrate 54 (e.g., silicon or other semiconductors known to those skilled in the art) having a source region 56, the drain region 58, and a channel region 60 between the source 56 and drain 58. A gate 62 is disposed above the channel region 60 and includes an electrical contact layer 64 overlying a semiconductor layer 66 that is separated from the substrate 54 via gate oxide layer 68. The source and drain regions 56, 58 are contained within isolation regions 70 which may be formed from a shallow trench of silicon dioxide.

Still referring to FIG. 6A, the backside of the substrate 54 may include an electrical contact layer 72 (e.g., metallic contact layer). In the embodiment of FIG. 6A, the spin injector 52 is disposed above the source region 56 of the FET 50. The spin injector 52 includes an array of ferromagnetic elements 20 disposed within a semiconductor material 12 as described herein. In the embodiment illustrated in FIG. 6A, the ferromagnetic elements 20 are vertically oriented posts 22. The spin injector 52 includes an electrical contact layer 74 disposed on a surface thereof. The electrical contact layer 74 may include a metallic layer disposed over the surface of the semiconductor 12. The vertically oriented posts 22 are substantially perpendicular to the electrical contact layer 74 of the spin injector 52.

Still referring to FIG. 6A, a second spin injector structure 76 is disposed above the drain region 58. The spin injector 76 structure includes a semiconductor material 78 having contained therein an array of ferromagnetic elements 80. The spin injector structure 76 located overtop the drain 58 includes an electrical contact layer 82. In this embodiment, a second ohmic contact layer 84 overlays a portion of the drain 58. This second contact layer 84 is used to "siphon off" those electrons, for example, that are oppositely spin-polarized with respect to the polarization direction of the electrical contact layer 82 and may accumulate within the substrate 54. The contact layer 84 may be formed from an electrically conductive metallic-based layer that is non-magnetic. As seen in FIG. 6A, the ferromagnetic-based contact layer 82 is interposed between the gate 62 and the outer contact layer 84. As seen in FIG. 6A, the array of ferromagnetic elements 20 comprise posts 81 although, as explained herein, the ferromagnetic elements 20 may be formed as plates or fins. Furthermore, the orientation of the posts may be perpendicular or parallel to the direction of current flow.

Figure 6B:
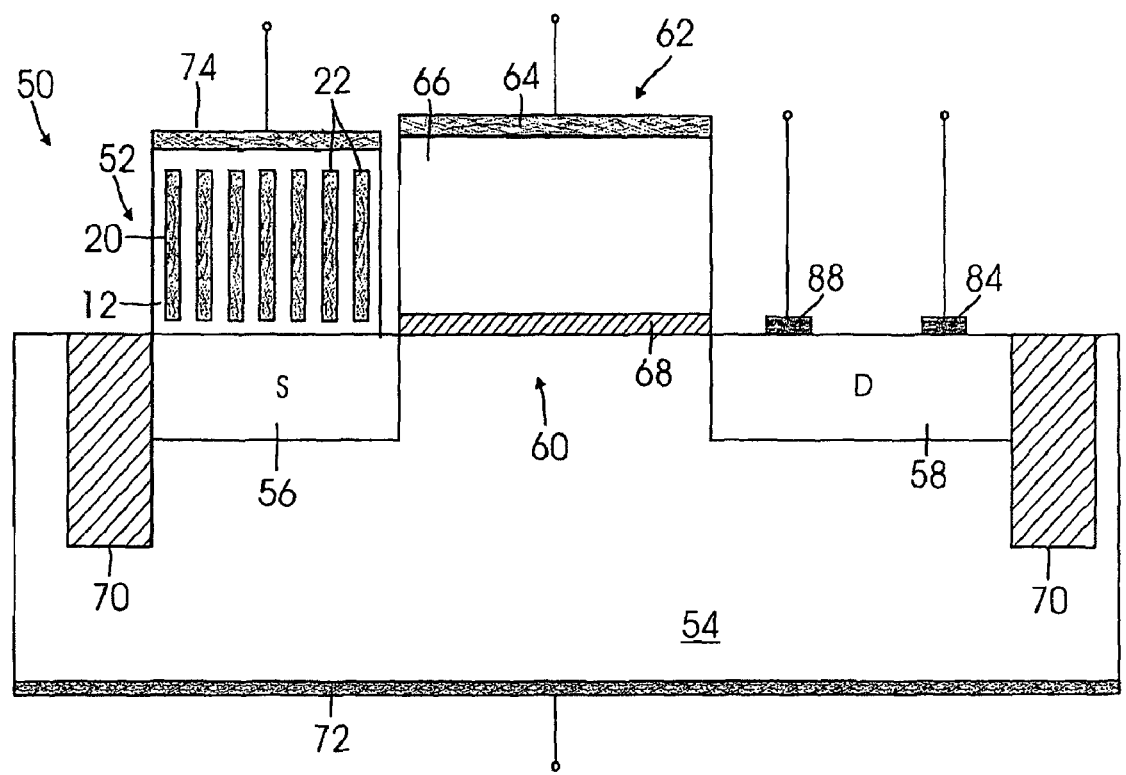
FIG. 6B is a cross-sectional view of a field effect transistor (FET) device that incorporates a spin injector according to another embodiment.

FIG. 6B illustrates an alternative embodiment of a FET 50 device. In this alternative embodiment, the spin injector structure 76 over the drain region 58 is omitted. The drain region 58 includes an ohmic contact layer 84 like that disclosed above. In addition, a ferromagnetic-based contact layer 88 is disposed over the drain region 58. The ferromagnetic-based contact layer 88 is formed from a ferromagnetic material such as α-Fe (or other forms of ferrite), Ni, Co, or an alloy such as Permalloy.

Figure 7A:
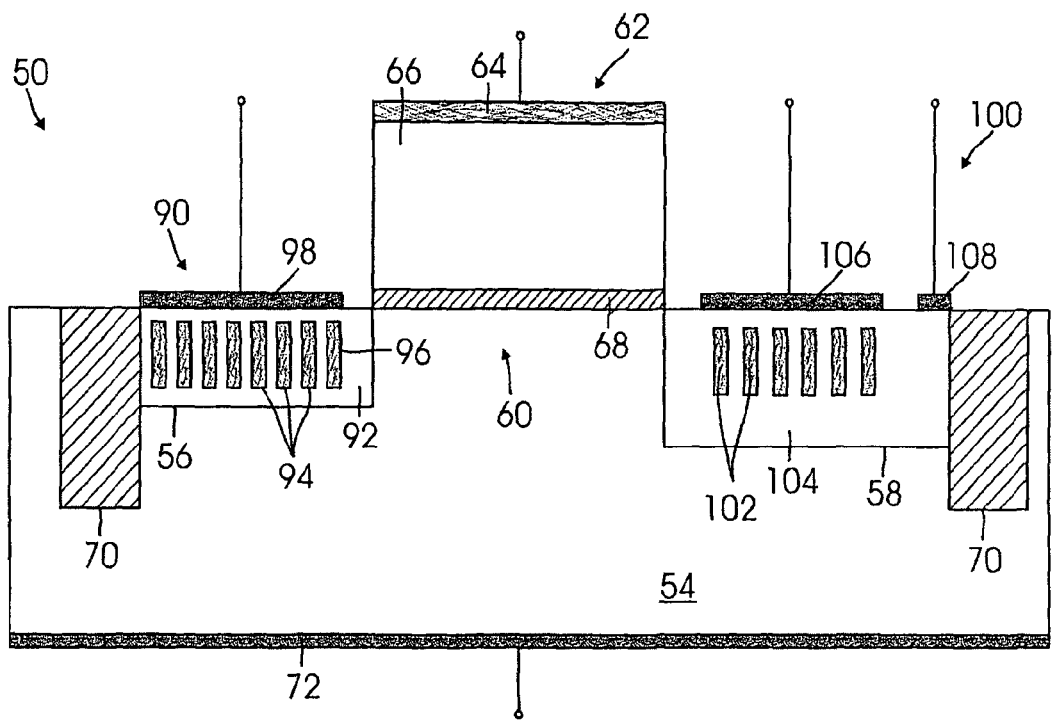
FIG. 7A is a cross-sectional view of a field effect transistor (FET) device that incorporates a spin injector according to another embodiment.
Figure 7B:
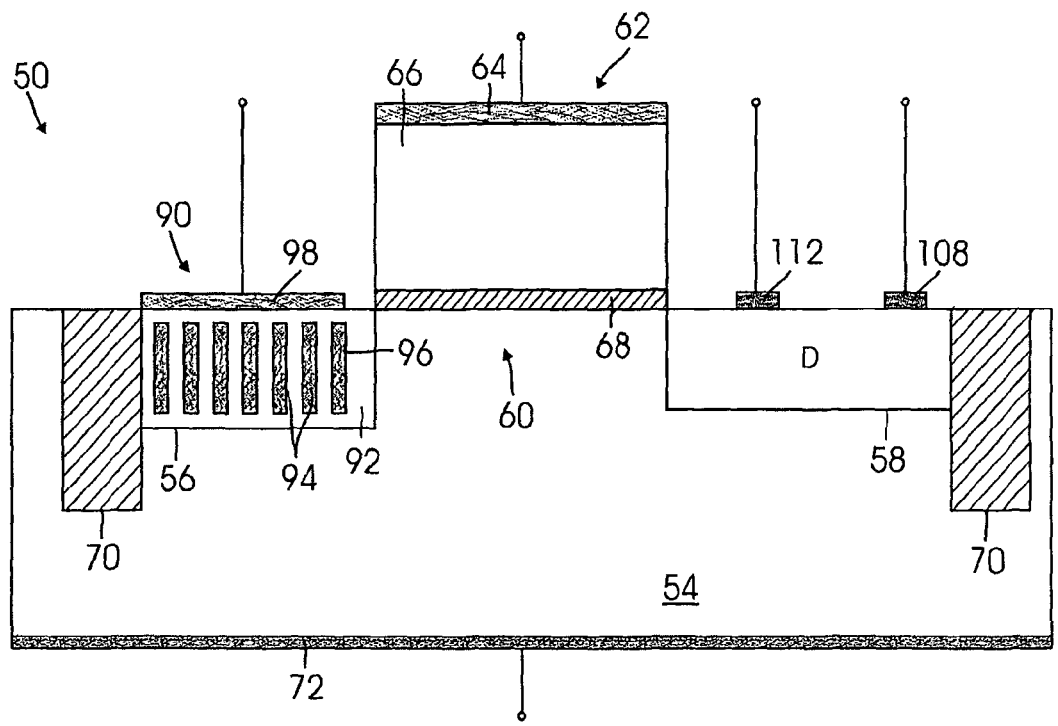
FIG. 7B is a cross-sectional view of a field effect transistor (FET) device that incorporates a spin injector according to still another embodiment.

FIGS. 7A and 7B illustrate two additional embodiments of a FET 50. With reference to FIG. 7A, the spin injector 90 is located in the source region 56. The spin injector 90 includes the semiconductor material 92 containing the array of ferromagnetic elements 94 which may include posts or plates. As seen in FIGS. 7A and 7B, the spin injector 90 includes an array of ferromagnetic posts 96. In this embodiment, the spin injector 90 is "subterranean" and contained within the source region 56 of the substrate 54. The spin injector 90 includes an electrical contact layer 98. Electrons thus pass from the contact layer 98 and into the spin injector 90 where they can then travel through the channel region 60 to the drain 58.

In the embodiment of FIG. 7A, the drain region 58 includes a spin injector structure 100 located within the substrate 54. In this regard, the spin injector 100 is also subterranean as the spin injector is not raised over the surface of the substrate 54. The spin injector 100 includes a plurality of ferromagnetic elements 102 which may includes, for example, posts or plates that are contained in a semiconductor material 104. The spin injector 100 includes an electrical contact 106 located on a surface thereof. A second ohmic electrical contact 108 is located over the drain region 58, again for purposes of siphoning non-polarized electrons. In this embodiment, the drain region 58 may extend deeper within the substrate 54 and also extend laterally to make room for the second electrical contact 108 as well as for preventing the accumulation of the oppositely polarized electrons in the channel region 60 near the drain electrode 106.

FIG. 7B illustrates another embodiment of a FET 50 in which the spin injector drain 100 of FIG. 7A is replaced with a drain region 58 having a first ferromagnetic contact layer 112 and a second ohmic contact layer 108 overlying the drain region 58. There is no spin injector structure 100 used in this embodiment. The ferromagnetic contact layer 112 is made from a ferromagnetic material such as those described herein.

Figure 8A:
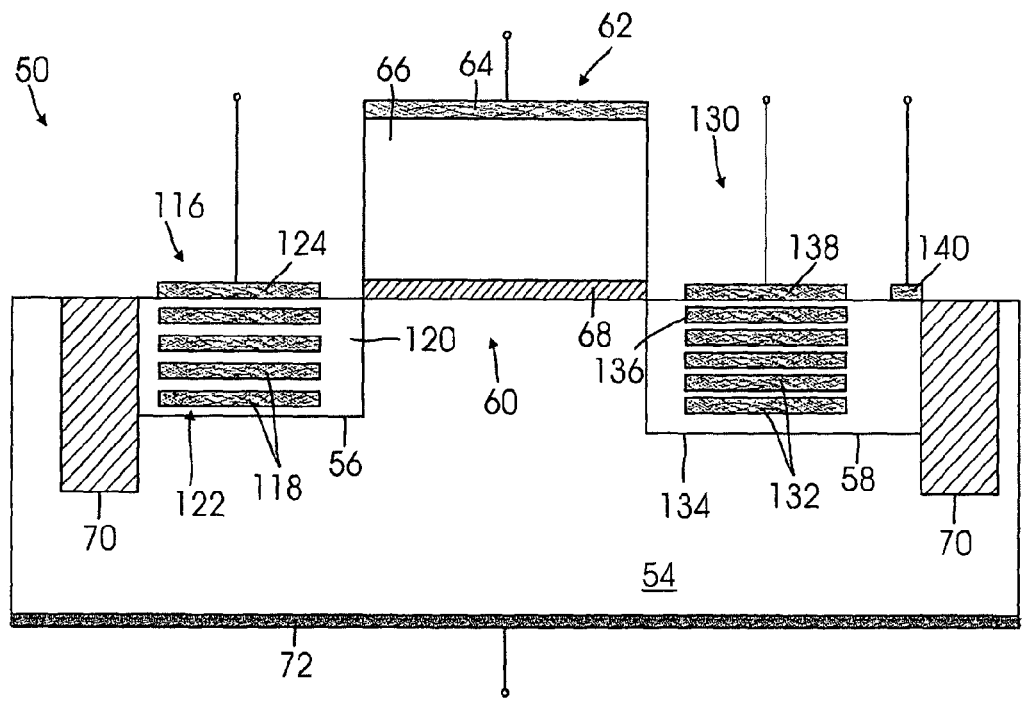
FIG. 8A is a cross-sectional view of a field effect transistor (FET) device that incorporates a spin injector according to another embodiment.
Figure 8B:
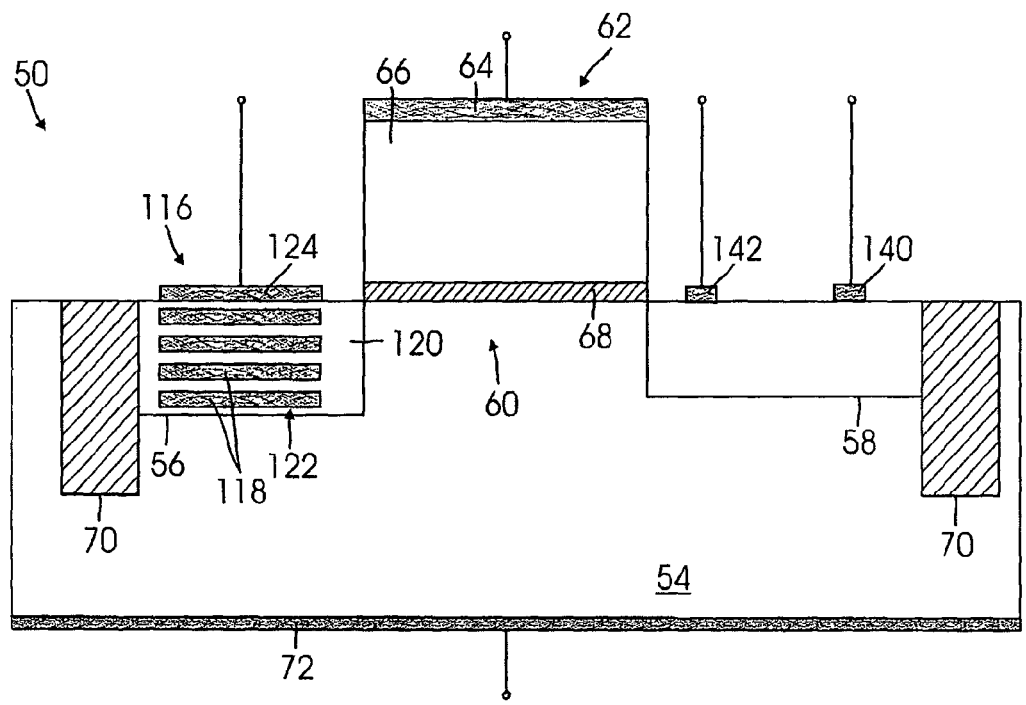
FIG. 8B is a cross-sectional view of a field effect transistor (FET) device that incorporates a spin injector according to still another embodiment.

FIGS. 8A and 8B illustrate yet another embodiment of a FET 50 that uses a spin injector. FIG. 8 illustrates an embodiment that uses a spin injector 116 that is located within the source region 56 of the semiconductor substrate 54. The spin injector 116 in this embodiment includes an array of ferromagnetic elements 118 disposed in a semiconductor material 120. The ferromagnetic elements 118, which in this embodiment are posts 122, are oriented generally parallel to the electrical contact 124 of the spin injector 116. The orientation of the ferromagnetic elements 118 is also generally parallel to the channel region 60 of the FET 50 (direction of travel of electrons or holes).

Still referring to FIG. 8A, the drain region 58 includes a second spin injector structure 130 located in a subterranean manner as described herein. The spin injector structure 130 includes an array of ferromagnetic elements 132 contained in a semiconductor material 134. The ferromagnetic elements 132 in this embodiment are formed as posts 136. The ferromagnetic elements 132 are arranged generally parallel to an electrical contact 138. The ferromagnetic elements 132 are also generally oriented parallel to the channel region 60. The drain region 58 further includes an electrical ohmic contact 140 on the surface of the drain region 58 for siphoning of non spin-polarized electrons that may accumulate within the substrate 54.

FIG. 8B illustrates an alternative embodiment of a FET 50 in which the spin injector structure 130 illustrated in FIG. 8A is replaced with a drain region 58 containing the ohmic contact 140 along with a ferromagnetic contact 142. The ferromagnetic contact 142 is disposed on the surface of the drain 58 between the gate 62 and the ohmic contact 140. The ferromagnetic contact 142 may be formed from a ferromagnetic material such as those disclosed herein.

The spin injectors described herein may be made using conventional semiconductor processes known to those skilled in the art. For example, the array of ferromagnetic elements 20 may be formed using lithographic exposure followed by etching (e.g., reactive ion etching) to create the voids or holes in the semiconductor substrate in which the ferromagnetic material is disposed. The ferromagnetic elements 20 may be formed by deposition of the ferromagnetic material(s) into the voids formed in the semiconductor material.

While embodiments of the present invention have been shown and described, various modifications may be made without departing from the scope of the present invention. The invention, therefore, should not be limited, except to the following claims, and their equivalents.

What is claimed is:

1. A spin injector device comprising:
   a semiconductor material
   a first electrical contact disposed on the semiconductor material at a first location and a second electrical contact disposed on the semiconductor material at a second location;
   an array of posts disposed in the semiconductor material, the array of posts substantially comprising a ferromagnetic material, wherein adjacent posts within the array are separated by a distance within the range between about 1 nm and 100 nm; and
   a pathway for electron or hole flow disposed in the semiconductor material between adjacent posts of the array wherein the array of posts are electrically isolated from the first and second electrical contacts and do not carry electric current.

2. The spin injector of claim 1, wherein the array of posts are generally arranged perpendicular to the first electrical contact.

3. The spin injector of claim 1, wherein the the array of posts are generally arranged parallel to the first electrical contact.

4. The spin injector of claim 1, wherein the length of the posts making up the array is sufficiently long so as to spin-polarize substantially all of the electrons passing from the first electrical contact to the second electrical contact.

5. The spin injector of claim 1, wherein the width of the array of the posts is sufficiently wide so as to spin-polarize substantially all of the electrons passing from the first electrical contact to the second electrical contact.

6. The spin injector of claim 1, wherein the ferromagnetic material is selected from the group consisting of iron, nickel, cobalt, and any alloy containing the same.

7. The spin injector of claim 1, wherein the spin injector is disposed over the source region of a field effect transistor.

8. The spin injector of claim 1, wherein the spin injector is disposed in the source region of a field effect transistor.

9. The spin injector of claim 1, wherein the spin injector is disposed over the drain region of a field effect transistor for use as a spin state analyzer.

10. The spin injector of claim 1, wherein the spin injector is disposed in the drain region of a field effect transistor.

11. A spin injector device comprising:
    a semiconductor material
    a first electrical contact disposed on the semiconductor material at a first location and a second electrical contact disposed on the semiconductor material at a second location;
    an array of posts disposed in the semiconductor material, the array of posts substantially comprising a ferromagnetic material; and
    a pathway for electron or hole flow disposed in the semiconductor material between adjacent posts of the array wherein the array of posts are electrically isolated from the first and second electrical contacts and do not carry electric current.

12. The spin injector of claim 11, wherein the array of posts are generally arranged perpendicular to the first electrical contact.

13. The spin injector of claim 11, wherein array of posts are generally arranged parallel to the first electrical contact.

14. The spin injector of claim 11, wherein the length of the posts making up the array is sufficiently long so as to spin-polarize substantially all of the electrons passing from the first electrical contact to the second electrical contact.

15. The spin injector of claim 11, wherein the width of the array of the posts is sufficiently wide so as to spin-polarize substantially all of the electrons passing from the first electrical contact to the second electrical contact.

16. The spin injector of claim 11, wherein the ferromagnetic material is selected from the group consisting of iron, nickel, cobalt, and any alloy containing the same.

17. The spin injector of claim 11, wherein the spin injector is disposed over the source region of a field effect transistor.

18. The spin injector of claim 11, wherein the spin injector is disposed in the source region of a field effect transistor.

19. The spin injector of claim 11, wherein the spin injector is disposed over the drain region of a field effect transistor for use as a spin state analyzer.

20. The spin injector of claim 11, wherein the spin injector is disposed in the drain region of a field effect transistor.

* * * * *